United States Patent [19]
Perner

[11] Patent Number: 6,128,239
[45] Date of Patent: Oct. 3, 2000

[54] MRAM DEVICE INCLUDING ANALOG SENSE AMPLIFIERS

[75] Inventor: Frederick A. Perner, Palo Alto, Calif.

[73] Assignee: Hewlett-Packard, Palo Alto, Calif.

[21] Appl. No.: 09/430,239

[22] Filed: Oct. 29, 1999

[51] Int. Cl.$^7$ .................................................. G11C 7/02
[52] U.S. Cl. ..................... 365/209; 365/158; 365/171; 365/173
[58] Field of Search ................................ 365/209, 158, 365/171, 172, 173

[56] References Cited

U.S. PATENT DOCUMENTS

| | | | |
|---|---|---|---|
| 5,793,697 | 8/1998 | Scheuerlein | 365/230.07 |
| 5,831,920 | 11/1998 | Chen et al. | 365/225.5 |
| 5,838,608 | 11/1998 | Zhu et al. | 365/158 |
| 5,852,574 | 12/1998 | Naji | 365/158 |
| 5,982,660 | 11/1999 | Bhattacharyya et al. | 365/173 |
| 5,986,925 | 11/1999 | Naji et al. | 365/158 |
| 6,055,178 | 4/2000 | Naji | 365/158 |

*Primary Examiner*—Richard Elms
*Assistant Examiner*—Hien Nguyen

[57] ABSTRACT

Resistance of a selected memory cell in a Magnetic Random Access Memory ("MRAM") device is sensed by a read circuit including a direct injection charge amplifier, an integrator capacitor and an analog sense amplifier. The direct injection charge amplifier supplies current to the integrator capacitor while maintaining an equipotential voltage on non-selected memory cells in the MRAM device. As the direct injection charge amplifier applies a fixed voltage to the selected memory cell, the sense amplifier generates an input signal having a transition that is time-delayed according to the voltage on the integrator capacitor; generates a reference signal having a time-fixed transition; and compares a relative occurrence of transitions in the input and reference signals. The relative occurrence indicates whether a logic value of '0' or '1' is stored in the selected memory cell.

17 Claims, 6 Drawing Sheets

MRAM DEVICE INCLUDING ANALOG SENSE AMPLIFIERS

BACKGROUND OF THE INVENTION

The invention relates to random access memory for data storage. More specifically, the invention relates to a magnetic random access memory device including an array of memory cells and sense amplifiers for sensing resistance of the memory cells.

Magnetic Random Access Memory ("MRAM") is a non-volatile memory that is being considered for long term data storage. Performing read and write operations on MRAM devices would be orders of magnitude faster than performing read and write operations on conventional long term storage devices such as hard drives. In addition, the MRAM devices would be more compact and would consume less power than hard drives and other conventional long term storage devices.

A typical MRAM device includes an array of memory cells. Word lines extend along rows of the memory cells, and bit lines extend along columns of the memory cells. Each memory cell is located at a cross point of a word line and a bit line.

A memory cell stores a bit of information as an orientation of a magnetization. The magnetization of each memory cell assumes one of two stable orientations at any given time. These two stable orientations, parallel and anti-parallel, represent logic values of "0" and "1."

The magnetization orientation affects the resistance of a memory cell such as a spin-tunneling device. For instance, resistance of a memory cell is a first value R if the magnetization orientation is parallel, and resistance of the memory cell is increased to a second value R+ΔR if the magnetization orientation is changed from parallel to anti-parallel. The magnetization orientation of a selected memory cell and, therefore, the logic state of the memory cell may be read by sensing the resistance state of the memory cell.

The resistance state may be sensed by applying a voltage to a selected memory cell and measuring a sense current that flows through the memory cell. Ideally, the resistance would be proportional to the sense current.

However, sensing the resistance state of a single memory cell in the array can be unreliable. All memory cells in the array are coupled together through many parallel paths. The resistance seen at one cross point equals the resistance of the memory cell at that cross point in parallel with resistances of memory cells in the other rows and columns (the array of memory cells may be characterized as a cross point resistor network).

Moreover, if the memory cell being sensed has a different resistance due to the stored magnetization, a small differential voltage may develop. This small differential voltage can give rise to a parasitic or "sneak path" current. The parasitic current is typically much larger than the sense current and, therefore, can obscure the sense current. Consequently, the parasitic current can prevent the resistance from being sensed.

Unreliability in sensing the resistance is compounded by manufacturing variations, variations in operating temperatures, and aging of the MRAM devices. These factors can cause the average value of resistance in the memory cell array to vary by a factor of two or three.

There is a need to reliably sense the resistance states of memory cells in MRAM devices.

There is also a need to perform the sensing at a low cost. Increasing MRAM device cost in an effort to improve reliability is not desirable.

SUMMARY OF THE INVENTION

These needs are met by the present invention. According to one aspect of the present invention, a resistance state of a selected memory cell of an MRAM device is sensed by using the selected memory cell and a reference voltage to charge an integrator; generating an input signal having a transition that is time-delayed according to a signal level on the integrator; generating a reference signal having a time-fixed transition; and comparing a relative occurrence of transitions in the input and reference signals. The memory cell is at a first resistance state if the input signal transition occurs before the reference signal transition, and the memory cell is at a second resistance state if the input signal transition occurs after the reference signal transition.

The sense amplifier may be made with an NMOS transmission gate and CMOS inverters. Such a sense amplifier has a small size and low cost.

Other aspects and advantages of the present invention will become apparent from the following detailed description, taken in conjunction with the accompanying drawings, illustrating by way of example the principles of the invention.

DETAILED DESCRIPTION OF THE INVENTION

As shown in the drawings for purposes of illustration, the present invention is embodied in a Magnetic Random Access Memory device. The MRAM device includes an array of memory cells and a read circuit for reading data from the memory cells. The read circuit, which includes direct injection charge amplifiers, integrator capacitors and analog sense amplifiers, can reliably sense different resistance states of selected memory cells in the array. The sense amplifiers can be made at a low cost with NMOS transmission gates and CMOS inverters.

Figure 1:
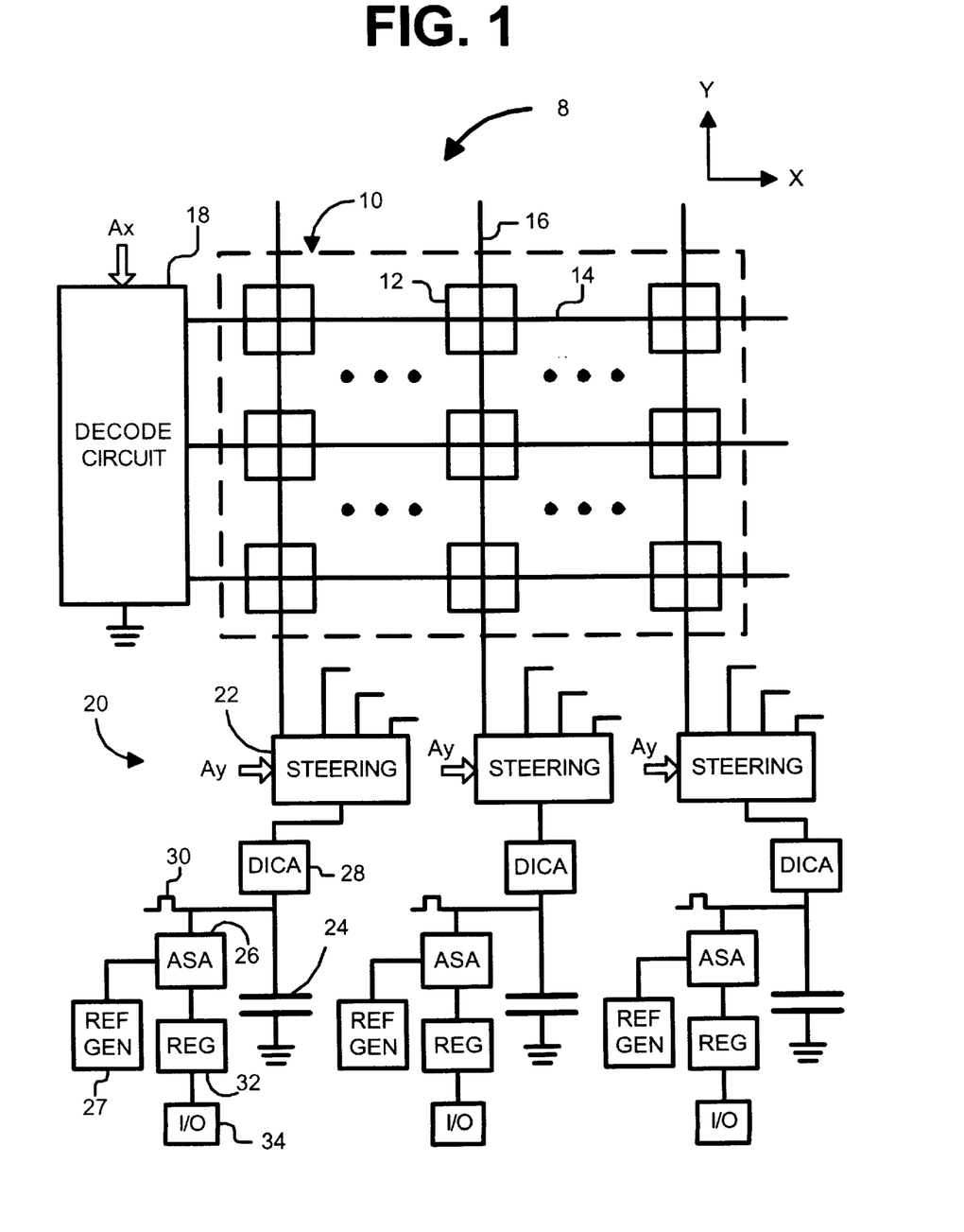
FIG. 1 is an illustration of an MRAM device including an array of memory cells and a read circuit.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of 1024× 1024 memory cells or larger may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a crossing point of a corresponding word line 14 and bit line 16.

The memory cells 12 are not limited to any particular type of device. For example the memory cells 12 may be spin dependent tunneling ("SDT") devices. A typical SDT device includes a "pinned" layer and a "free" layer. The pinned layer has a magnetization that is oriented in a plane, but fixed so as not to rotate in the presence of an applied magnetic field in a range of interest. The free layer has a magnetization orientation that is not pinned. Rather, the magnetization can be oriented in either of two directions along an axis (the "easy" axis) lying in a plane. If the magnetization of the free and pinned layers 50 and 52 are in the same direction, the orientation is said to be "parallel" (as indicated by the arrows in FIG. 2a). If the magnetization of the free and pinned 50 and 52 layers are in opposite directions, the orientation is said to be "anti-parallel" (as indicated by the arrows in FIG. 2b).

Figure 2A:
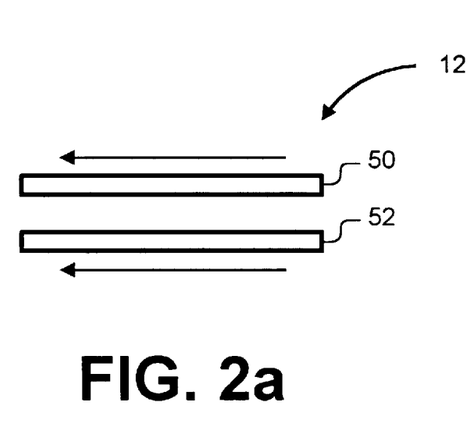
FIGS. 2a and 2b are illustrations of parallel and anti-parallel magnetization orientation of a memory cell.
Figure 2B:
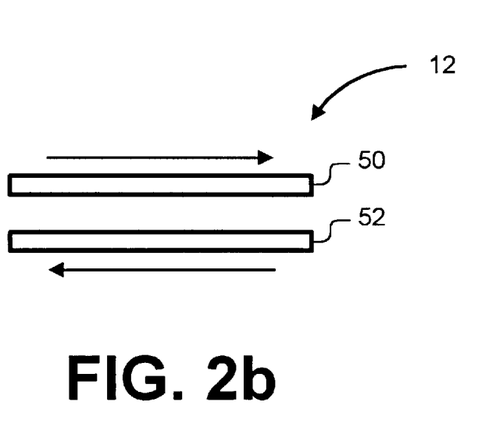

The free layer and the pinned layer are separated by an insulating tunnel barrier. The insulating tunnel barrier allows quantum mechanical tunneling to occur between the free and pinned layers. This tunneling phenomenon is electron spin dependent, making the resistance of the SDT device a function of the relative orientations of the magnetization of the free and pinned layers.

For instance, resistance of a memory cell 12 is a first value R if the orientation of magnetization of the free and pinned layers is parallel. Resistance of the memory cell 12 is increased to a second value R+ΔR if the magnetization orientation is changed from parallel to anti-parallel. A typical resistance R may be about 1 megaohms. A typical change in resistance ΔR may about 10% of the resistance R.

Data is stored in a memory cell 12 by orienting the magnetization along the easy axis of the free layer. A logic value of "0" may be stored in the memory cell 12 by orienting the magnetization of the free layer such that the magnetization orientation is parallel, and a logic value of "1" may be stored in the memory cell 12 by orienting the magnetization of the free layer such that the magnetization orientation is anti-parallel.

Each memory cell 12 retains its orientation of magnetization, even in the absence of external power. Therefore, the memory cells 12 are non-volatile.

The MRAM device 8 also includes a row decoder 18 for selecting word lines 14 during read and write operations. A word line 14 may be selected during a read operation by connecting that word line 14 to ground The MRAM device 8 also includes a read circuit for sensing the resistance of selected memory cells 12 during read operations and a write circuit for orienting the magnetization of the selected memory cells 12 during write operations. The read circuit is indicated generally at 20. The write circuit is not shown in order to simplify the explanation of the present invention.

The read circuit 20 includes a plurality of steering circuits 22, integrator capacitors 24, analog sense amplifiers 26, reference signal generators 27, direct injection charge amplifiers 28 and reset switches 30. A memory cell 12 is selected by supplying a row address Ax to the row decoder 18 and a column address Ay to the steering circuits 22. In response to the row address Ax, the row decoder 18 couples a word line 14 to ground. In response to the column address Ay, a steering circuit 22 couples a bit line 16 to a charge amplifier 28. A selected memory cell 12 lies at the cross point of selected word and bit lines 14 and 16.

For a selected bit line 16, the direct injection charge amplifier 28 supplies a current to its integrator capacitor 24 while maintaining a potential on the non-selected memory cells 12 of the selected bit line 16. This potential is equal to the potential applied to non-selected rows and columns of the MRAM array 10. As the charge amplifier 28 applies a fixed voltage to the selected bit line 16, a resulting constant sense current is supplied to the integrator capacitor 24. The analog sense amplifier 26 can determine the resistance state of the memory cell 12 and, therefore, the logic value stored in the memory cell 12. An output of the analog sense amplifier 26 is supplied to an output register 32 which, in turn, is coupled to an I/O pad 34 of the MRAM device 8.

The read circuit 20 may read out data in m-bit words, whereby the resistance states of a number m of memory cells 12 are sensed simultaneously. For example, a first group of k contiguous bit lines 16 might be multiplexed into a first charge amplifier 28, a second group of k contiguous bit lines 16 might be multiplexed into a second charge amplifier 28, and so on. An m-bit word might be read out by operating m consecutive sense/charge amplifiers 26/28 simultaneously.

If a single sense amplifier 26 can fit a pitch of four columns, 256 sense amplifiers 26 may be used for a 1024× 1024 array 10 of memory cells 12. A total of k=4 bit lines 16 may be multiplexed into each charge amplifier 28. If the MRAM device 8 has multiple levels of memory cell arrays (see, for example, FIG. 7), bit lines 16 from the additional levels may be multiplexed into the charge amplifiers 28.

Each steering circuit 22 includes a set of switches that connect each bit line 16 to either a constant voltage source or to a charge amplifier 28. Each steering circuit 22 further includes a column decoder. The column decoder selects only one switch to connect the selected bit line 16 to the charge amplifier 28. All other (unselected) bit lines 16 are be connected to the constant voltage source. The constant voltage source may be supplied from an external circuit.

Figure 3:
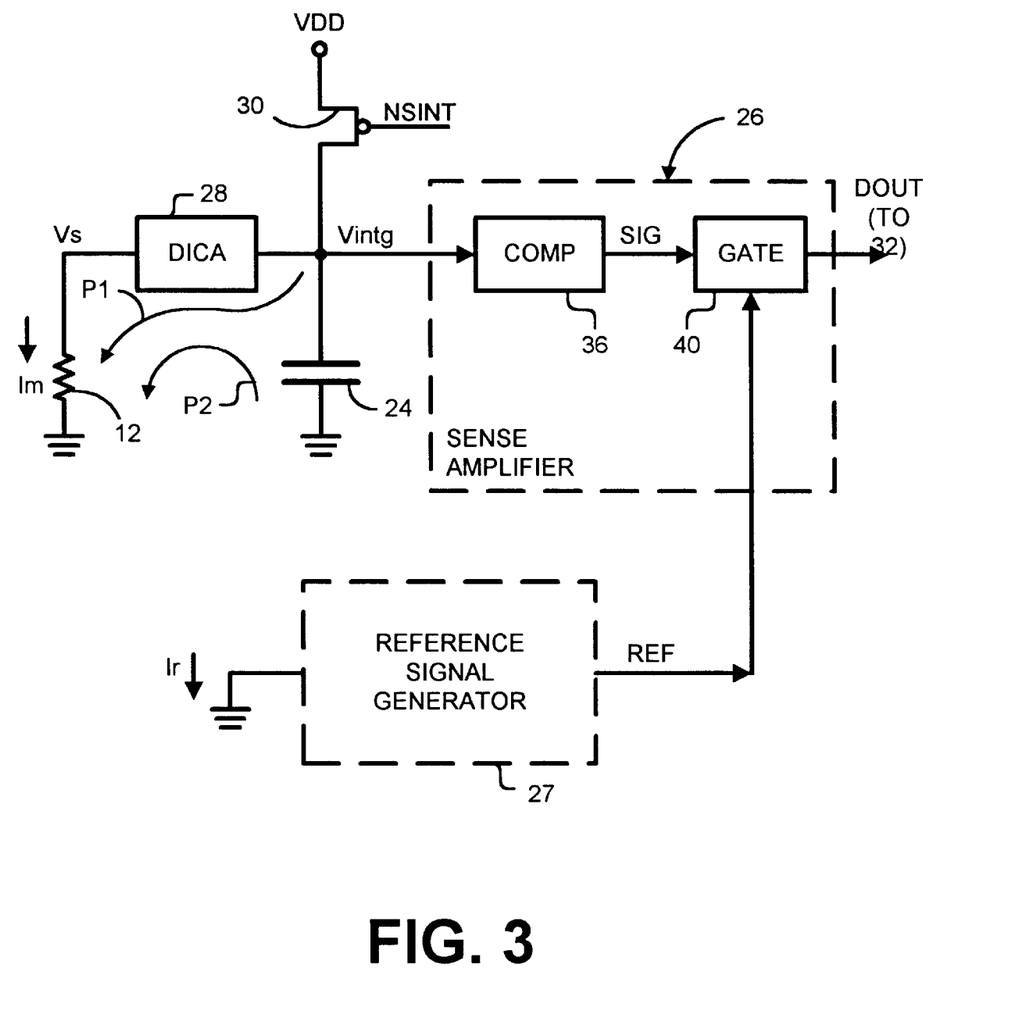
FIG. 3 is an illustration of an analog sense amplifier, which forms a part of the read circuit.

Reference is now made to FIG. 3. A selected memory cell 12 is represented by a resistor. The reset switch 30 may be a PMOS transistor. A control signal NSINT controls whether the reset switch 30 is on (conducting) or off (not conducting). When the reset switch 30 is turned on, a supply voltage VDD is applied to the integrator capacitor 24 and the selected memory cell 12 through the direct injection charge amplifier 28. Thus, the integrator capacitor 24 is charged as a first signal follows a first path P1, which goes through the reset switch 30 and the selected memory cell 12. When the reset switch 30 is turned off, the integrator capacitor 24 is discharged through the selected memory cell 12. A sense current Im follows a second path P2 and flows through the selected memory cell 12. As long as the integrator voltage is greater than the voltage across the selected memory cell 12, the capacitor 24 functions as a linear integrator.

The control signal NSINT is a "global" signal that may be supplied from an on-chip controller or an external controller. The control signal NSINT may control many sense amplifiers 26 simultaneously or, if supplied from an on chip controller, may be directed to specific sense amplifiers 26 as a means of limiting sense amplifier-generated noise and sense amplifier peak power requirements.

The direct injection charge amplifier 28 controls a sense voltage Vs across the memory cells 12 independent of the sense current. When a constant voltage is applied to all memory cells 12 (that is an equipotential across the memory cells), variations in resistance will not cause a current variation across the remaining parallel memory elements 12 and, thus, the parasitic sense current can be made substantially less than the sense current Im. The current that flows in the direct injection charge amplifier 28 is then directly proportional to the resistance of the selected memory cell 12 without having to make corrections or adjustments for variations in the sense voltage Vs.

A direct injection charge amplifier 28 that can minimize the voltage difference across the memory cells 12 is disclosed in U.S. Ser. No. 09/430,238 filed Oct. 29, 1999 (Attorney Docket No. PDNO 10990999-1). The direct injection charge amplifier 28 includes a high gain negative feedback amplifier for controlling the selected bit line voltage (that is, the sense voltage Vs) to a set value and minimizing the variance of the sense voltage Vs over a wide range of sense currents.

The resistance of the memory cell 12 and the capacitance of the integrator capacitor 24 determine how fast the integrator capacitor 24 is discharged after the reset switch 30 is opened. All other parameters being equal, the integrator capacitor 24 will discharge faster when the memory cell 12 has a resistance of R (logic '0') than when the memory cell 12 has a resistance of R+ΔR (logic "1").

Figure 4A:
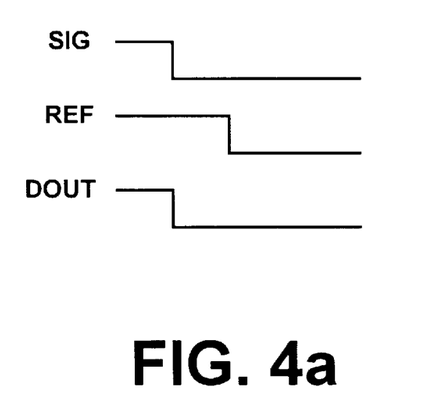
FIGS. 4a and 4b are timing diagrams of signals generated by the analog sense amplifier.
Figure 4B:
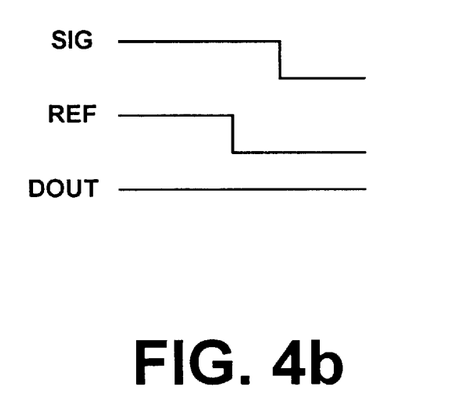

Additional reference is now made to FIGS. 4a and 4b, The sense amplifier 26 generates an input signal SIG having a logic signal transition that is time-delayed according to a voltage Vintg on the integrator capacitor 24; and a reference signal generator 27 generates a reference signal REF having a time-fixed transition. The sense amplifier 26 compares a relative occurrence of transitions in the input and reference signals SIG and REF. The memory cell 12 is at a first resistance state if the input signal transition occurs before the reference signal transition (see FIG. 4a); and the memory cell 12 is at a second resistance state if the input signal transition occurs after the reference signal transition (see FIG. 4b). Thus, the input signal transition has a time relationship to the reference signal transition, the time relationship being proportional to the sense current Im flowing through the memory cell 12. An output signal DOUT of the analog sense amplifier 26 indicates the relative occurrence of transitions and, therefore, the logic state of the selected memory cell 12. The output signal DOUT is supplied to an output register 32.

When the reference signal REF makes a transition, for example, from Hi to Lo, the state of the output register 32 is frozen and the data stored in that output register 32 is valid and ready to be read. A "Read is Complete" or "Data Valid" signal may be generated to indicate whether the output register 32 is ready to be read. If only a single sense amplifier 26 is active, the Data Valid signal may be derived directly from the reference signal REF of that sense amplifier 26. If more than one sense amplifier 26 is active, the reference signals REF from all independent sense amplifiers 26 may be routed to an AND gate. An output of the AND gate indicates whether the data is valid in all of the output registers 32.

The input signal SIG is generated by a sense comparator 36, which is coupled to the integrator capacitor 24. The input signal transition occurs when the voltage Vintg on the integrator 24 decays from VDD until it is less than a threshold (e.g., when Vintg>VDD/2).

The output of the sense comparator 36 is coupled to the output register 32 by a transmission gate 40. The transmission gate is turned on and off by the reference signal REF.

Figure 5:
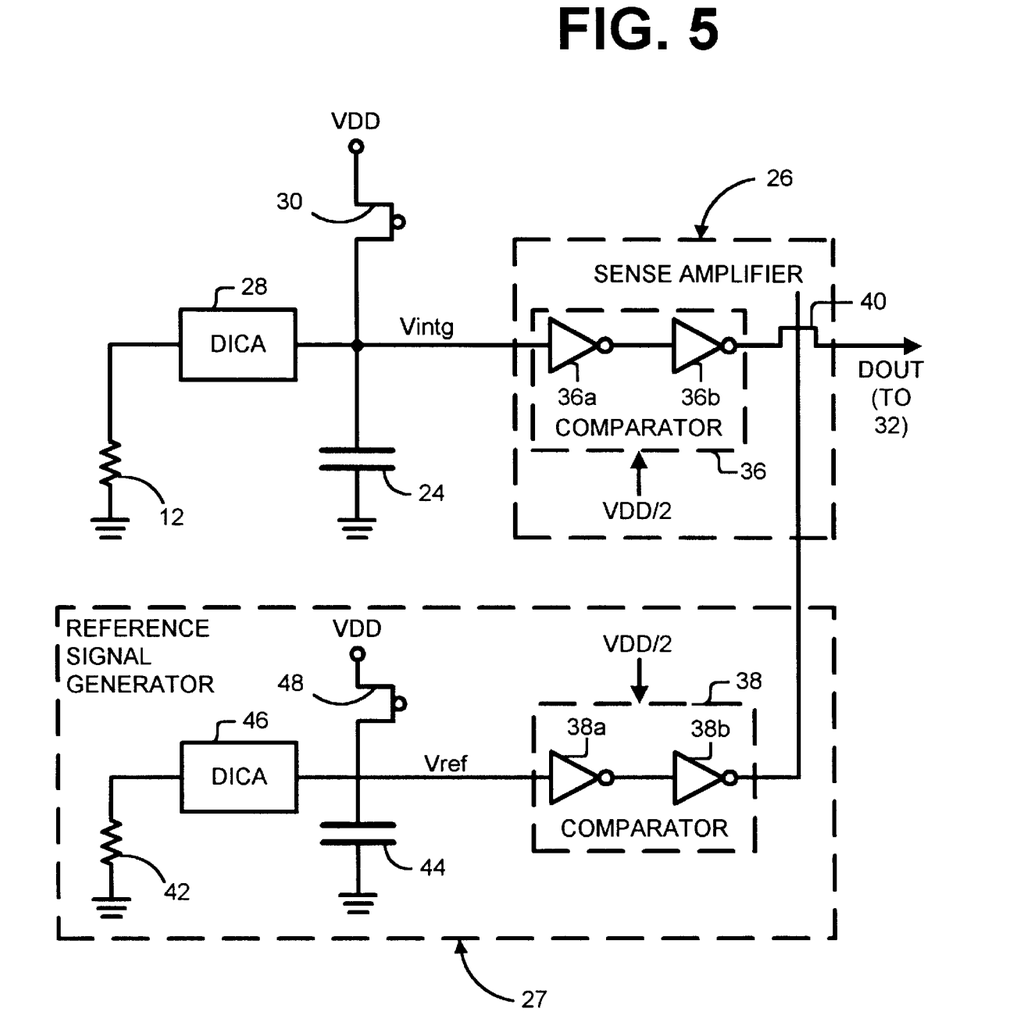
FIG. 5 is an illustration of an analog sense amplifier including CMOS inverters and an NMOS transmission gate.

FIG. 5 shows an exemplary implementation of the sense amplifier 26 and the reference signal generator 27. In the sense amplifier 26, the first comparator circuit 36 includes first and second CMOS inverters 36a and 36b that are connected in series. The integrator voltage Vintg is compared to a switching threshold voltage. The threshold voltage VDD/2 is determined by the transfer characteristics of the first CMOS inverter 36a. The first CMOS inverter 36a has two stable states and a narrow, high gain transition region near the switching threshold voltage. The first CMOS inverter 36a is used to detect when the time-varying voltage Vintg from the integrator capacitor 24 crosses the switching threshold voltage. When the switching threshold voltage is crossed, the output of the first CMOS inverter 36a transitions from a Lo state to a Hi state. The second CMOS inverter 36b is used to amplify and shape the switching transition to fall within a very narrow range of first stage input voltages. The output of the second CMOS inverter 36b has a crisp transition from Hi to Lo when the integrator capacitor voltage Vintg crosses the switching threshold voltage. Transistor sizing and additional transistors may be used to move the switching threshold to other values, however, the basic CMOS inverter is robust and area efficient circuit for this application.

The reference signal generator 27 includes a reference comparator 38. The reference comparator 38 also includes a pair of CMOS inverters 38a and 38b that are connected in series. The reference signal voltage Vref is also compared to the threshold voltage VDD/2.

The transmission gate 40 includes an NMOS transistor. If the state of the memory cell is "0" then the stored resistance will be smaller than the reference resistance, and the switching delay of the sense signal transition will occur before the reference signal transition. Consequently, the sense signal SIG will propagate through the transmission gate 40 and cause the contents of the output register 32 to go Lo before the second comparator 38 turns off the transmission gate 40.

If the state of the memory cell is '1' then the stored resistance will be greater than the reference resistance, and the reference signal transition will occur before the input signal transition. Consequently, the reference comparator 38 will turn off the transmission gate 40 before the sense signal SIG can propagate to the output register 32. Thus, the state of the output register 32 will remain at its initial Hi state.

The reference signal generator 27 includes a resistive element 42, a reference capacitor 44, a reference charge amplifier 46, and a reference reset switch 48. The reference capacitor 44 is charged to the supply voltage VDD when the reference switch 48 is closed, and the voltage Vintg on the reference capacitor 44 is allowed to decay through the resistive element 42 when the reference switch 48 is opened. The reference switch 48 is also controlled by the control signal NSINT. The reference signal transition occurs when the reference voltage decays from voltage VDD until it is less than a threshold (e.g., when Vref<VDD/2).

The resistive element 42 may have a resistance of R+ΔR/2. The resistive element may be a resistor or a reference memory cell.

If the resistive element 42 is a reference memory cell, one or more columns of reference cells may be added to the array 10. When a row is selected, a selected reference cell is associated with each selected memory cell. It may be desirable to have more than one reference column in a large array so that local MRAM array variations are minimized by locating reference cells close to selected memory cells. In this case where the reference signal REF is generated from a memory cell similar to the selected memory cells, the reference memory cell is written with a data '0' (low resistance state) and the reference capacitor 44 has a slightly greater capacitance than the integrator capacitor 24. The size of the integrator and reference capacitors 24 and 40 may be optimized for sensing a '0' or a '1' for a range of values of MRAM resistances, ΔR ratios, and array voltages.

A reference signal generator 27 may be provided for each sense amplifier 26. In the alternative, a single reference signal generator 27 may be shared by several sense amplifiers 26. For example, a single reference signal generator 27 may be physically placed between two adjacent sense amplifiers 26 to control the transmission gates 40 of the two adjacent sense amplifiers 26.

Figure 6:
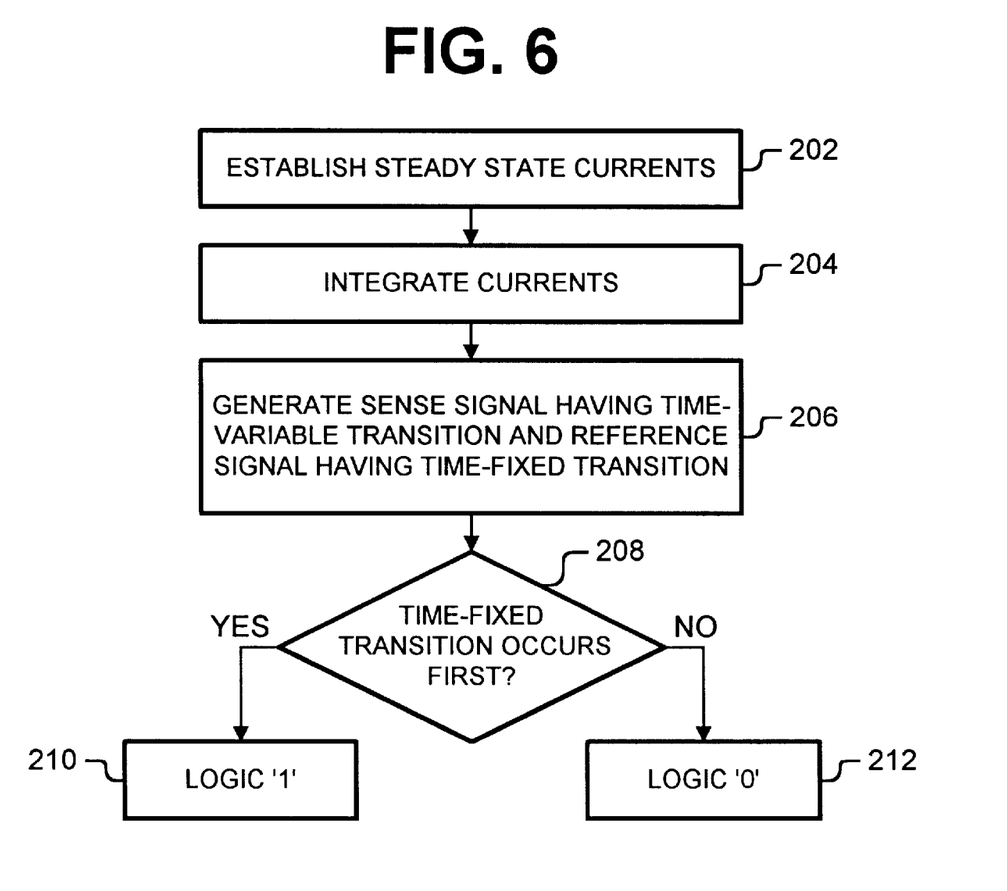
FIG. 6 is a flowchart of a method of sensing a resistance state of a memory cell.

Reference is now made to FIG. 6, which illustrates a read operation on a selected memory cell 12. The reset switches 30 and 46 are closed to initialize the output register 32, and they remain closed for a fixed interval to charge the integrator and reference capacitors 24 and 44 to VDD and to allow transients to settle out and thereby establish steady state currents through the selected memory and reference cells 12 and 27 (block 202). Settling time is a function of column time constants. A typical settling time for a MRAM resistance of 1 MΩ and a column capacitance of 0.5 pf might be about two microseconds.

After the fixed interval has elapsed, the reset switches 30 and 48 are opened simultaneously, whereby a race condition begins. Opening the reset switches 30 and 48 causes currents to flow to the sense and reference capacitors 24 and 44. As the currents are integrated (block 204), an integrator voltage Vintg develops on the integrator capacitor 24, and a reference signal voltage Vref develops on the reference capacitor 44. The integrator voltage Vintg will fall at a faster rate than the reference voltage Vref if the resistance of the selected memory cell 12 is less than the resistance of the reference cell 27 (i.e., memory cell resistance equals R, which corresponds to a logic '0'). Conversely, the reference voltage Vref will fall at a faster rate than the integrator voltage Vintg if the resistance of the selected memory cell 12 is greater than the resistance of the reference cell (i.e., memory cell resistance equals R+ΔR, which corresponds to a logic '1').

When the integrator voltage Vintg reaches a threshold (e.g., VDD/2), an output of the sense comparator inverter 36b goes Lo (i.e., a transition will be generated) (block 206). Similarly, when the reference voltage Vref reaches a threshold, an output of the reference comparator inverter 38b goes Lo (i.e., a transition will be generated (block 206).

If the reference voltage Vref reaches the threshold before the integrator voltage Vintg (block 208), the reference comparator 38 will turn off the transmission gate 40 and thereby block the output of the sense comparator 36 from propagating to the output register 32. Thus, a logic '1' remains stored in the output register 32 (block 210). If the integrator voltage Vintg reaches the threshold first (block 208), the output of the sense comparator 36 will propagate to the output register 32 before the transmission gate 40 can be turned off. Thus, a logic '0' is stored in the register (block 212).

Figure 7:
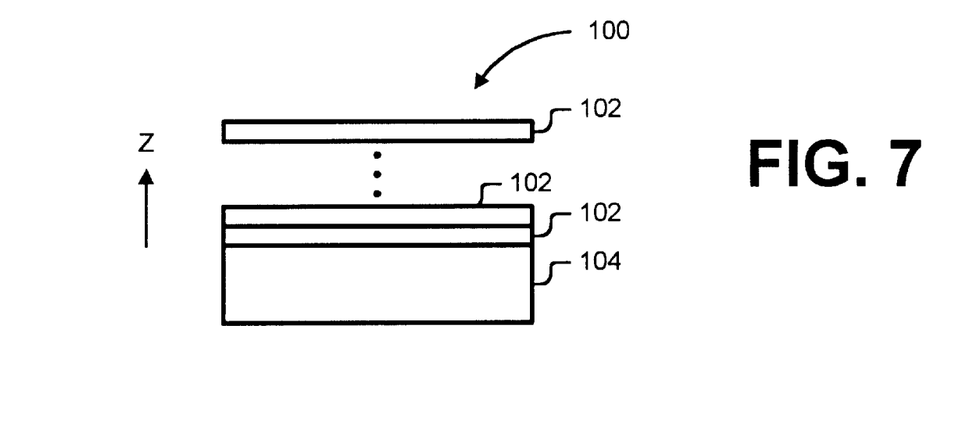
FIG. 7 is an illustration of an MRAM chip including multiple levels.

Reference is now made to FIG. 7, which illustrates a multi-level MRAM chip 100. The MRAM chip 100 includes a number Z of memory cell levels or planes 102 that are stacked in a z-direction on a substrate 104. The number Z is a positive integer where Z≧1. The memory cell levels 102 may be separated by insulating material (not shown) such as silicon dioxide. Read and write circuits may be fabricated on the substrate 104. The read and write circuits may include additional multiplexers for selecting the levels that are read from and written to.

Thus disclosed is an MRAM device including a circuit that can read data reliably. The read circuit reduces parasitic currents such that the sense currents are not obscured during read operations. In addition, sensitivity of the MRAM device to aging and manufacturing and operating temperature variations is reduced.

Sense amplifiers made with NMOS transmission gates and CMOS inverters can operate at low power supply voltages and a use very low sense voltage variation. These sense amplifiers can fit into an area no wider than four wire pitches, which allows all of the sense amplifiers to fit underneath a large MRAM memory array. Such sense amplifiers can significantly reduce the cost of the MRAM array.

Figure 8:
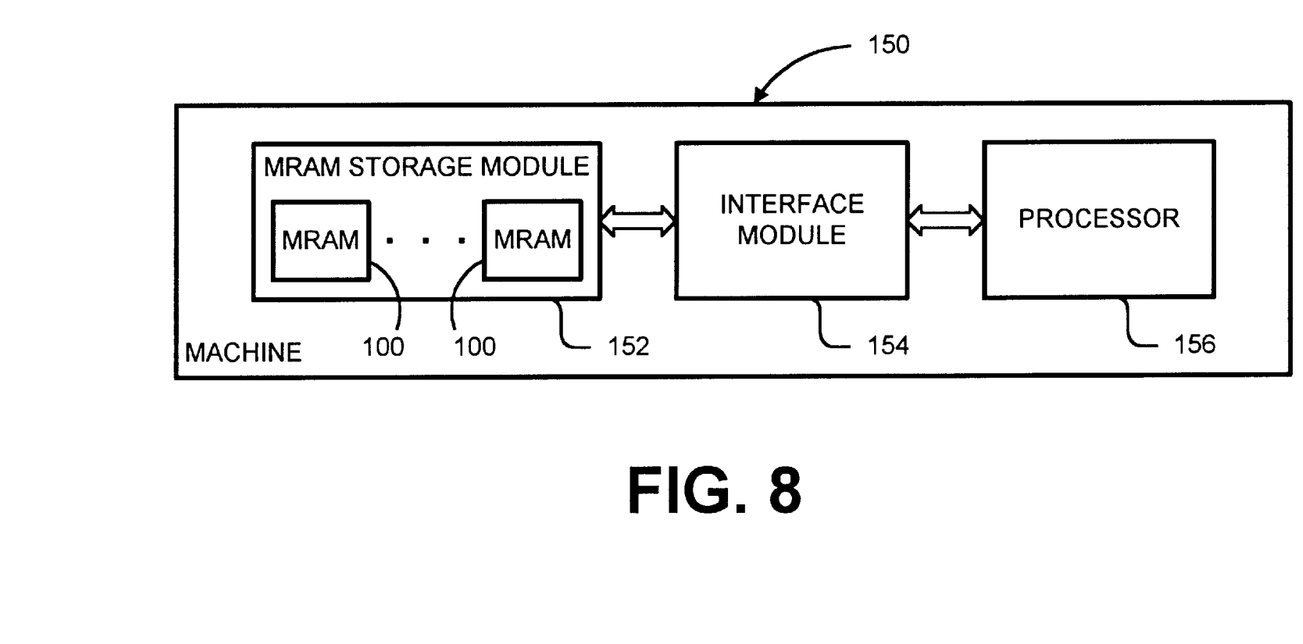
FIG. 8 is an illustration of a machine including one or more MRAM chips.

The MRAM device according to the present invention may be used in a wide variety of applications. FIG. 8 shows an exemplary general application for one or more MRAM chips 100. The general application is embodied by a machine 150 including an MRAM storage module 152, an interface module 154 and a processor 156. The MRAM storage module 152 includes one or more MRAM chips 100 for long term storage. The interface module 154 provides an interface between the processor 156 and the MRAM storage module 152. The machine 150 could also include fast volatile memory (e.g., SRAM) for short term storage.

For a machine 150 such as a notebook computer or personal computer, the MRAM storage module 152 might include a number of MRAM chips 100 and the interface module 154 might include an EIDE or SCSI interface. For a machine 150 such as a server, the MRAM storage module 152 might include a greater number of MRAM chips 100, and the interface module 154 might include a fiber channel or SCSI interface. Such MRAM storage modules 152 could replace or supplement conventional long term storage devices such as hard drives.

For a machine 150 such as a digital camera, the MRAM storage module 152 might include a smaller number of MRAM chips 100 and the interface module 154 might include a camera interface. Such an MRAM storage module 152 would allow long term storage of digital images on-board the digital camera.

The MRAM device according to the present invention offers many advantages over conventional long-term data storage devices such as hard drives. Accessing data from the MRAM devices is orders of magnitude faster than accessing data from conventional long-term storage devices such as hard drives. Additionally, MRAM devices are more compact than hard drives.

The invention is not limited to the specific embodiments described and illustrated above. For instance, the invention is not limited to the use of spin dependent tunneling devices. Other types of devices that could be used include, but are not limited to, giant magnetoresistance ("GMR") devices.

The invention has been described in connection with the rows being oriented along the easy axis. However, the rows and columns could be transposed.

Accordingly, the invention is not limited to the specific embodiments described and illustrated above. Instead, the invention is construed according to the claims that follow.

What is claimed is:

1. A circuit for sensing a resistance state of a memory cell in an MRAM device, the circuit comprising:

an integrator;

an input signal generator for generating an input signal having a transition that is time-delayed according to a signal level on the integrator;

a reference signal generator for generating a reference signal having a time-fixed transition; and a gate for indicating the resistance state based upon a relative occurrence of transitions in the input and reference signals.

2. The circuit of claim 1, wherein the input signal generator includes a first charge amplifier coupled between the memory cell and the integrator, and a first comparator coupled to the integrator; and wherein the gate has a transmission path coupled to an output of one of the comparator and the reference signal generator, the gate being controlled by an output of the other of the comparator and the reference signal generator.

3. The circuit of claim 2, wherein the reference signal generator includes a resistive element, a second integrator, a second charge amplifier coupled between the resistive element and the second integrator, and a second comparator coupled to the second integrator.

4. The circuit of claim 3, wherein the resistive element includes a memory cell.

5. The circuit of claim 2, wherein the comparator includes CMOS inverters and wherein the gate includes an NMOS transistor.

6. The circuit of claim 1, further comprising a switch coupled between the integrator and a voltage supply line, a steady state current flowing through the memory cell when the switch is closed, a sense current flowing through the memory cell when the switch is opened.

7. A circuit for sensing resistance of a memory cell in an MRAM device, the circuit comprising:

a first comparator including a first pair of CMOS inverters connected in series, an input of the first comparator being adapted to receive an input signal;

a second comparator including a second pair of CMOS inverters connected in series, an input of the second comparator being adapted to receive a reference signal; and an NMOS transistor having a gate coupled to an output of one of the comparators, the NMOS transistor having a drain-source path coupled to the other one of the comparators.

8. An MRAM device comprising:

an array of memory cells; and a read circuit for sensing resistance states of selected memory cells in the array, the read circuit including:

means for applying a potential to a selected memory cell and an equal potential to unselected memory cells in the array during a read operation;

means for integrating a current flowing through the selected memory cell during the read operation;

means for generating an input signal having a transition that is time-delayed according to a voltage on the integrating means;

means for generating a reference signal having a time-fixed transition; and means for indicating a resistance state based upon a relative occurrence of transitions in the input and reference signals;

whereby a first resistance state of the memory cell is indicated if the input signal transition occurs before the reference signal transition; and whereby a second resistance state of the memory cell is indicated if the input signal transition occurs after the reference signal transition.

9. An MRAM device comprising:

an array of memory cells;

a plurality of bit lines crossing the memory cells; and a read circuit for sensing resistance states of selected memory cells in the array, the read circuit including:

a steering switch having inputs coupled to multiple bit lines;

a charge amplifier having an input coupled to an output of the steering switch;

an integrator coupled to an output of the charge amplifier;

a comparator, coupled to the integrator, for generating an input signal having a transition that is time-delayed according to a signal level on the integrator;

a reference signal generator for generating a reference signal having a time-fixed transition; and a transmission gate for indicating a resistance state based upon a relative occurrence of transitions in the input and reference signals.

10. The MRAM device of claim 9, wherein the reference signal generator includes a resistive element, a second integrator, a second charge amplifier coupled between the resistive element and the second integrator, and a second comparator coupled to the second integrator.

11. The MRAM device of claim 10, wherein the resistive element includes a reference memory cell.

12. The MRAM device of claim 10, wherein the comparators include CMOS inverters and wherein the gate includes an NMOS transistor.

13. The MRAM device of claim 9, further comprising a switch coupled between the integrator and a voltage supply line, a steady state current flowing through the memory cell when thatch is closed, a sense current flowing through the memory cell when the switch is opened.

14. A method of sensing a resistance state of a memory cell of an MRAM device comprising:

applying a voltage to the memory cell;

integrating a current flowing through the selected memory cell;

generating an input signal having a transition that is time-delayed according to a level of integrated current;

generating a reference signal having a time-fixed transition; and indicating the resistance state based upon a relative occurrence of transitions in the input and reference signals;

whereby a first resistance state is indicated if the input signal transition occurs before the reference signal transition; and whereby a second resistance state is indicated if the input signal transition occurs after the reference signal transition.

15. The method of claim 14, wherein the current is integrated by charging an integrator and then allowing a voltage on the integrator to decay; and wherein the input signal is generated by comparing the decaying voltage to a threshold.

16. The method of claim 15, further comprising the step of allowing a steady state current to flow through the memory cell before the integration is performed.

17. The method of claim 14, wherein the reference signal is generated by using a reference memory cell to charge an integrator; and generating the reference signal transition based upon a voltage level on the integrator.

* * * * *